United States Patent
Frank et al.

(10) Patent No.: US 7,327,574 B2
(45) Date of Patent: Feb. 5, 2008

(54) HEATSINK MODULE FOR ELECTRONIC DEVICE

(75) Inventors: Wang Frank, Taipei (TW); Chang Chun-Yi, Taipei (TW)

(73) Assignee: Inventec Corporation (TW)

( * ) Notice: Subject to any disclaimer, the term of this patent is extended or adjusted under 35 U.S.C. 154(b) by 291 days.

(21) Appl. No.: 11/057,922

(22) Filed: Feb. 15, 2005

(65) Prior Publication Data
US 2006/0181850 A1 Aug. 17, 2006

(51) Int. Cl.
*H05K 7/20* (2006.01)
*F28F 7/00* (2006.01)

(52) U.S. Cl. .................... 361/711; 361/700; 361/704; 361/707; 361/709; 165/80.2; 165/80.3

(58) Field of Classification Search ........... 361/695, 361/698, 699–704, 707, 709, 711, 688, 687; 165/80.2, 80.3, 80.4, 80.5, 104.33; 174/15.2, 174/15.1; 257/706, 714, 717, 718, 722, 719
See application file for complete search history.

(56) References Cited

U.S. PATENT DOCUMENTS

| | | | |
|---|---|---|---|
| 6,304,441 B1 * | 10/2001 | Han | 361/687 |
| 6,347,036 B1 * | 2/2002 | Yeager et al. | 361/687 |
| 6,373,700 B1 * | 4/2002 | Wang | 361/698 |
| 6,510,052 B2 * | 1/2003 | Ishikawa et al. | 361/687 |
| 6,567,269 B2 * | 5/2003 | Homer et al. | 361/700 |
| 6,650,540 B2 * | 11/2003 | Ishikawa | 361/695 |
| 6,781,835 B2 * | 8/2004 | Hashimoto et al. | 361/697 |
| 6,883,594 B2 * | 4/2005 | Sarraf et al. | 165/104.33 |
| 6,900,990 B2 * | 5/2005 | Tomioka | 361/752 |
| 6,966,363 B2 * | 11/2005 | Gailus et al. | 165/185 |
| 2004/0188080 A1 * | 9/2004 | Gailus et al. | 165/185 |
| 2004/0201958 A1 * | 10/2004 | Lev | 361/687 |
| 2005/0073817 A1 * | 4/2005 | Barsun et al. | 361/760 |
| 2005/0180110 A1 * | 8/2005 | I-Yung et al. | 361/700 |

* cited by examiner

*Primary Examiner*—Lisa Lea-Edmonds
*Assistant Examiner*—Anthony M Haughton
(74) *Attorney, Agent, or Firm*—Raymond J. Ho; Venable LLP

(57) ABSTRACT

A heatsink module for electronic device includes a heatpipe, a board, a heatsink and at least a resilient plate. The board is mounted on one end of the heatpipe, and formed with at least a fixing hole. The heatsink is mounted on the other end of the heatpipe. The resilient plate fastens the board onto the electronic component of the electronic device. The resilient force of the resilient plate helps the board accommodated to the height of the electronic component and well contact with the electronic component. The board is made by stamping; therefore, the manufacture cost is lower. Also, the board and the resilient plate are thinner so as to reduce the height of the installation and help the thinness of electronic device.

4 Claims, 3 Drawing Sheets

HEATSINK MODULE FOR ELECTRONIC DEVICE

BACKGROUND OF THE INVENTION

1. Field of the Invention

The invention generally relates to a heatsink module, and in particular relates to a heatsink module applicable to an electronic device.

2. Description of the Related Art

Nowadays electronic components (such as chips) in an electronic device (such as a laptop) often generate massive heat under operation and raise the temperature of the electronic components. If the heat is not well dissipated, the electronic components will be overheated to cause the operation unstable, or even cause the entire electronic device malfunction or crash. Unfortunately, as the operational speeds of electronic devices are unceasingly increasing, the heat generation is also increasing. Therefore, the applications of heatsinks on electronic devices are getting more and more important. FIG. 1 shows a constructional view of a conventional heatsink module for a computer chip. The heatsink module includes a block 11, a fastening member 12, a heatpipe 13 and a heatsink (heat dissipation fins) 14. The block 11 is mounted on a chip (not shown in the drawing) through the fastening member 12 so that the heat generated by the chip is conducted via the block 11 and the heatpipe 13 to the heatsink 14. A fan (not shown in the drawing) expels cooling air through the heatsink 14 to dissipate the heat to the air and cools down the chip.

The fastening member 12 has several holes 15 for fixing the fastening member 12 through screws to the printed circuit board that bears the chip. The fastening member 12 has several elastic arms 16 to provide resilient force in the height direction of the chip when mounting the block 11 on the chip. The block 11 and the fastening member 12 can fit with chips of different heights and provide the surfaces between the block 11 and the chip a tight fitting.

However, the aforesaid heatsink module has the following problems. First, the block 11 is made by die-casting that the service life of the die-casting mould is shorter than that of a stamping die. Therefore, the manufacture cost of die-casting method is not easy to be reduced. Second, because the fastening member 12 is mounted above the block 11, it increases the height of installation upon the chip and limits its applications to modern electronic devices that emphasize light, thin, short and small. In other words, the conventional heatsink module has the disadvantages of higher manufacture cost and larger dimensions.

SUMMARY OF THE INVENTION

The object of the invention is to provide a heatsink module applicable to electronic devices. The heatsink module solves the problems of conventional higher cost die-casting component and higher dimension structure by manufacturing through stamping and giving a thinner construction.

In order to achieve the aforesaid object, a heatsink module for electronic device according to the invention includes a heatpipe, a board, a heatsink and at least a resilient plate. The board is a stamped part formed with at least a fixing hole for being mounted on one end of the heatpipe. The heatsink is mounted on the other end of the heatpipe. The resilient plate includes at least a hole corresponding to the hole of the board for fixing the board onto the electronic component of the electronic device that is to be cooled down. The resilient force of the resilient plate helps the board accommodated with the height of the electronic component and well contact with the electronic component.

The board in the invention is made by stamping. Therefore, the manufacture cost is lower. Also, the board and the resilient plate are thinner so as to reduce the height of the installation and help the thinness of electronic device.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
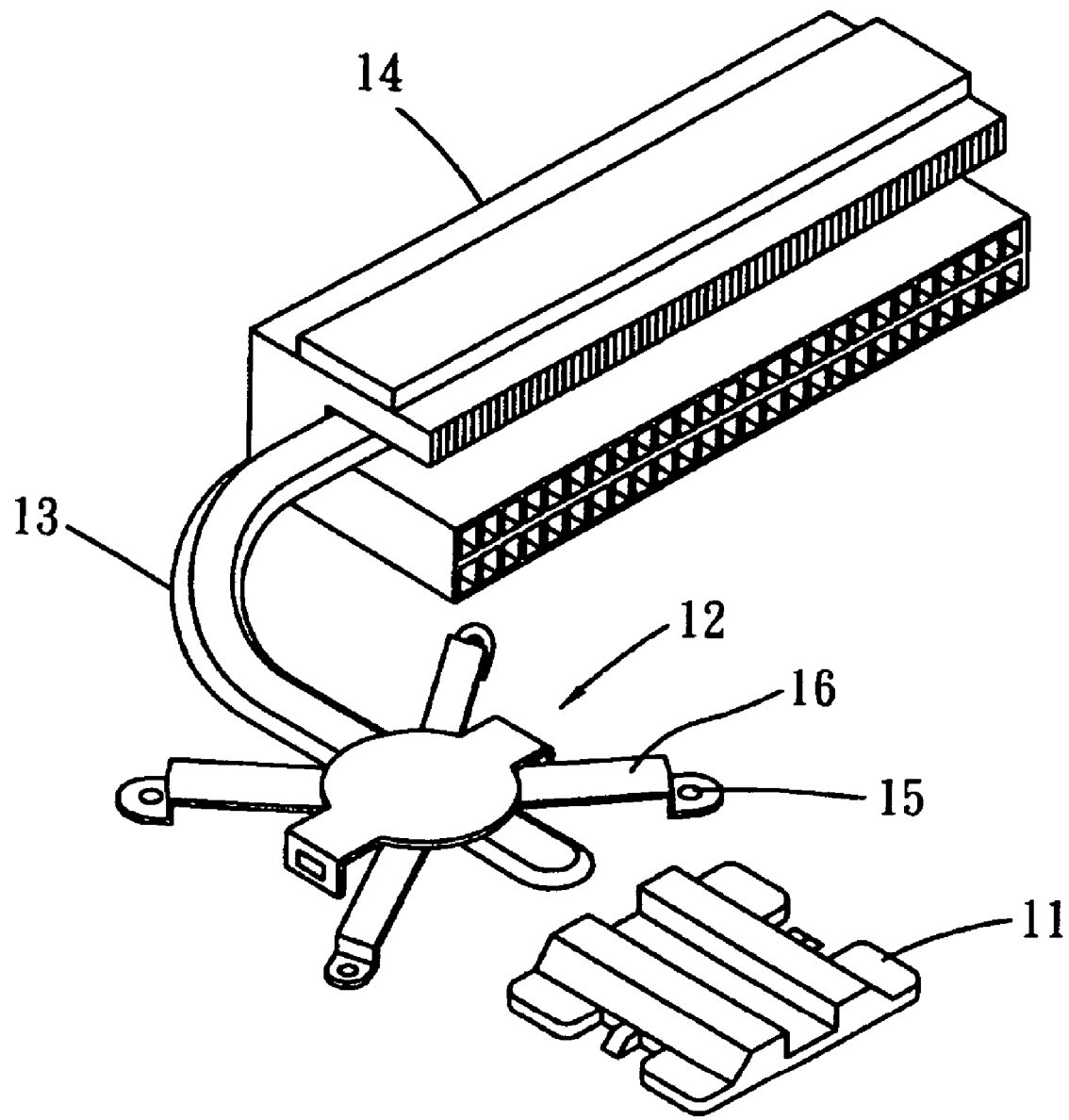
FIG. 1 is a constructional view of a conventional heatsink module for a computer chip.
Figure 2:
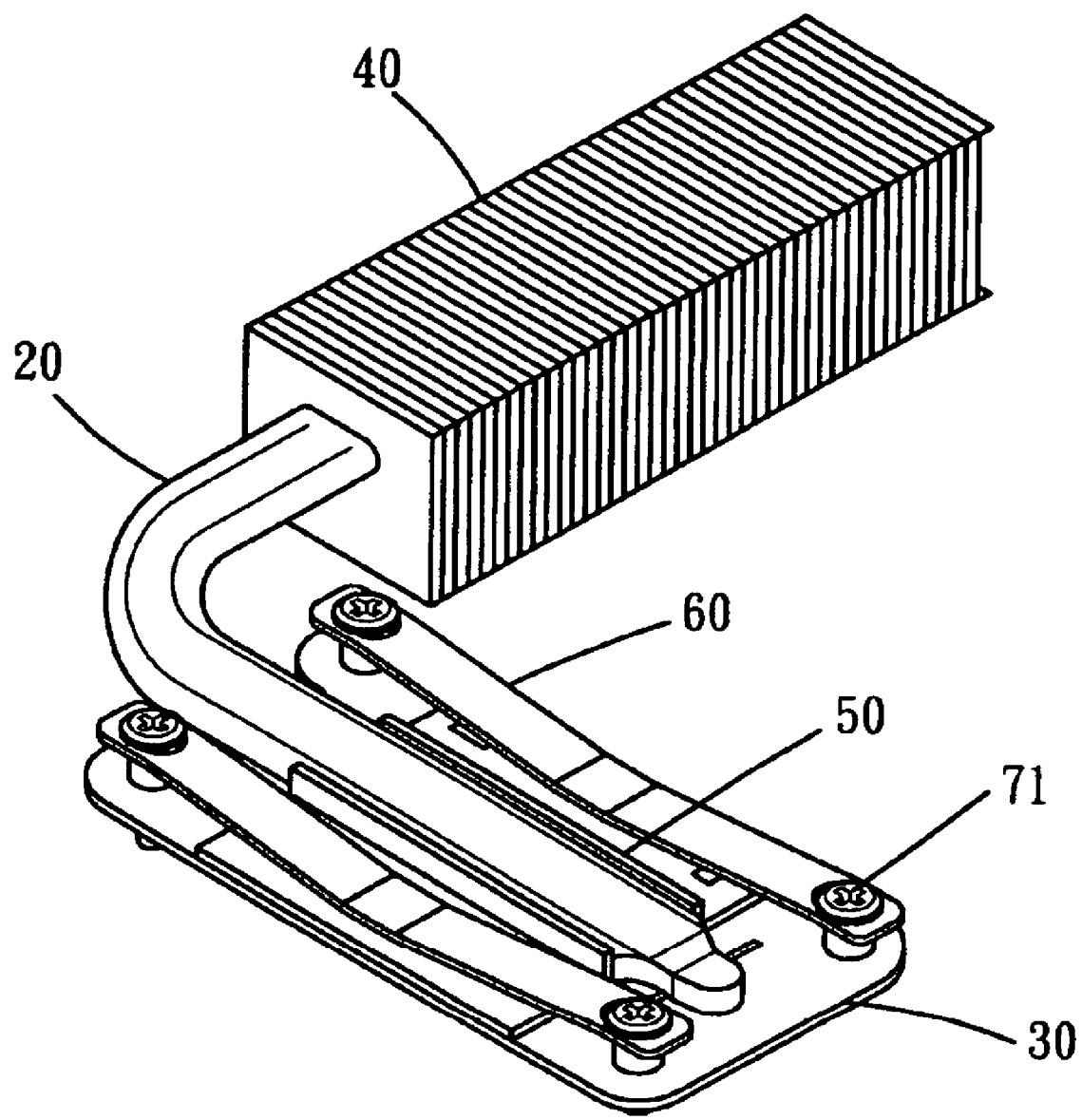
FIG. 2 is a constructional view of a heatsink module of the invention.

Please refer to FIG. 2, a constructional view of an embodiment of the invention. A heatsink module applicable to a computer chip (central processing unit) includes a heatpipe 20, a board 30, a heatsink 40, at least an L-rib 50 and at least a resilient plate 60. The board 30 is a stamped part and fixed to one end of the heatpipe 20. The board 30 is made of thermal conductive material, such as copper or aluminum. The heatsink 40 is mounted on the other end of the heatpipe 20. The L-rib 50 is a stamped part made of thermal conductive material, such as copper or aluminium. The L-rib 50 is welded on the board 30. The resilient plate 60 is made of sheet metal and welded, screwed or riveted on the board 30. Screws 71 are held on the resilient plates and passing through the board 30 for fastening the board 30 to the computer chip (not shown in the drawing) so that the heat generated by the chip is conducted through the board 30 and the heatpipe 20 to the heatsink 40. The heat is dissipated into the air by a fan (not shown in the drawing) at the heatsink 40 so as to cool down the chip.

Figure 3:
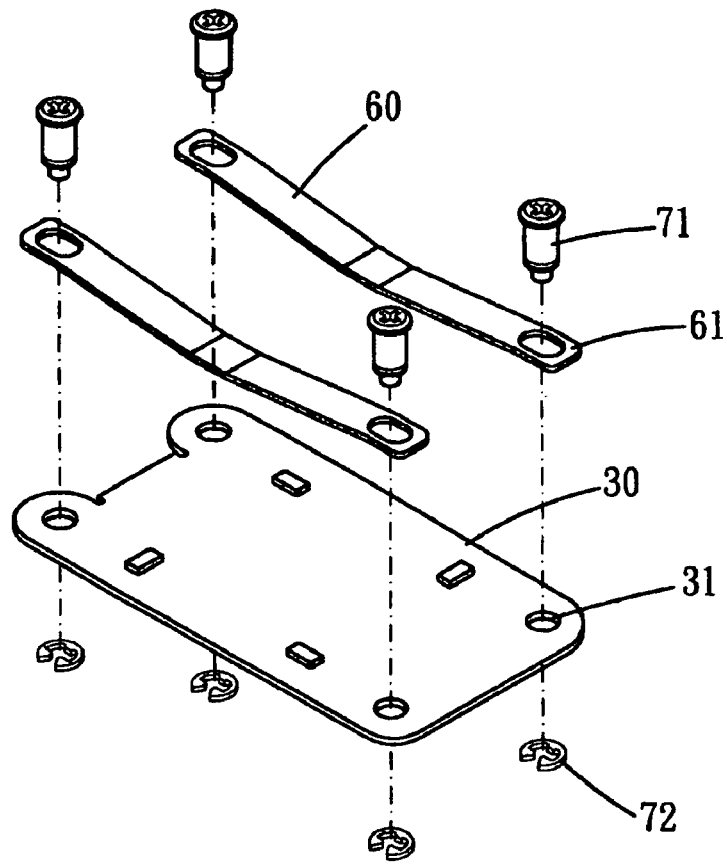
FIG. 3 is partial constructional view of the invention showing the resilient plate and the board.

Please refer to FIG. 3 for details of the resilient plate 60 and the board 30. The resilient plate is formed with mounting holes 61 corresponding to fixing holes 31 formed on the board 30. Screws 71 passing through the mounting holes 61 and the fixing holes 31 are further held by fixing members 72 at the back surface of the board 30. The fixing members 72 can be E-rings or the like to prevent the screws 71 from being departed from the assembly by the resilient force of the resilient plates 60. Therefore, users can easily and directly install the board assembly with the on-board screws 71 and efficiently finish the installation. In addition, as a result of the resilient force of the resilient plate 60, this board 30 is elastically movable along the vertical direction in a certain range so as to be adapted to different heights of chips and the variations of manufacturing and installation processes. It ensures the surface of the board 30 well contact with the chip and ensures the efficiency of heat dissipation.

Figure 4:
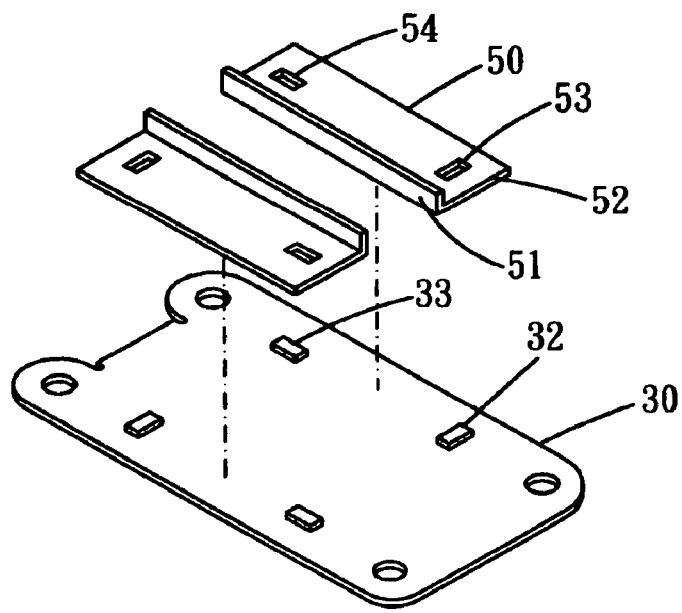
FIG. 4 is a partial constructional view of the invention showing the L-ribs and the board.

Please refer to FIG. 4 for details of the L-ribs 50 and the board 30. The L-rib 50 is a stamped part having a vertical portion 51 and a horizontal portion 52. The horizontal portion 52 is welded to the board 30. The vertical portion 51 contacts with the heatpipe 20 for increasing the heat transfer area with the heatpipe 20. The L-rib 50 also enhances the structural strength of the board 30.

In the embodiment, the L-rib 50 is formed with two rectangular holes 53, 54. The rectangular holes 53, 54 have their longitudinal sides allocated perpendicularly. The board 30 is also formed with rectangular extrusions 32, 33 corresponding to the rectangular holes 53, 54 so as to fit with each other. The directions of the rectangular holes and extrusions are for foolproof positioning so that the assembler will not assemble the L-rib 50 in a wrong direction to cause the vertical portion 51 losing contact with the heatpipe 20.

In conclusion, the heatsink module of the invention uses stamped part that lowers the manufacturing cost. Also, the structure has a lower height in comparison with conventional heatsink modules. Therefore, it helps the thinness of the electronic device that it is applied to.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink module applicable to an electronic component to dissipate heat generated by the electronic component, comprising:

a conductive board contacted to the electronic component for conducting the heat from the electronic component to the conductive board;

a heatpipe, of which one end of the heatpipe is fixed on the conductive board to conduct the heat from the conductive board to the other end of the heatpipe;

at least a resilient plate positioned on the conductive board, the resilient plate normally pushing the conductive board toward the electronic component;

at least a rib positioned on the conductive board, the rib being contact with the end of the heatpipe for transferring the heat from the conductive board to the heatpipe, the rib being formed with at least a rectangular hole corresponding to at least a rectangular extrusion formed on the conductive board for positioning; and a heatsink mounted on the other end of the heatpipe to dissipate heat from the other end of the heatpipe.

2. A heatsink module according to claim 1, further comprising at least a screw and a fixing member, the conductive board including at least a fixing hole, the resilient plate including at least a mounting hole corresponding to the fixing hole of the conductive board, the screw being passed through the fixing hole and the mounting hole, and fixed onto the fixing member to fasten the resilient plate, the conductive board and the electronic component from departing.

3. A heatsink module according to claim 2, wherein the fixing member is an E-ring.

4. A heatsink module according to claim 1, wherein the rib is an L-rib.

* * * * *